(12) United States Patent
Tomita

(10) Patent No.: US 8,004,086 B2
(45) Date of Patent: *Aug. 23, 2011

(54) SEMICONDUCTOR DEVICE

(75) Inventor: Kazuo Tomita, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/884,256

(22) Filed: Sep. 17, 2010

(65) Prior Publication Data

US 2011/0001242 A1  Jan. 6, 2011

Related U.S. Application Data

(63) Continuation of application No. 12/461,134, filed on Aug. 3, 2009, now Pat. No. 7,843,066, which is a continuation of application No. 12/186,973, filed on Aug. 6, 2008, now abandoned, which is a continuation of application No. 11/455,699, filed on Jun. 20, 2006, now Pat. No. 7,420,278.

(30) Foreign Application Priority Data

Jun. 23, 2005  (JP) .................................. 2005-183264

(51) Int. Cl.
*H01L 23/52* (2006.01)
(52) U.S. Cl. ........................................ 257/758; 257/211
(58) Field of Classification Search .................. 257/758, 257/211
See application file for complete search history.

(56) References Cited

U.S. PATENT DOCUMENTS 6,908,841 B2   6/2005 Burrell et al.
2004/0058520 A1   3/2004 Burrell et al.

FOREIGN PATENT DOCUMENTS

JP   2001-267323   9/2001

*Primary Examiner* — Douglas M Menz
(74) *Attorney, Agent, or Firm* — Oblon, Spivak, McClelland, Maier & Neustadt, L.L.P.

(57) ABSTRACT

The present invention provides a semiconductor device capable of preventing occurrence of cracking and the like, taking a large area, where wiring and the like that function as elemental devices can be arranged, within a plurality of interlayer insulation films, and reducing production cost. The semiconductor device according to the present invention has a low dielectric constant film having a dielectric constant of not less than 2.7. In the low dielectric constant film and the like, materials (e.g., a first dummy pattern, a second dummy pattern) with a larger hardness than that of the low dielectric constant film are formed at a part under a pad part.

29 Claims, 14 Drawing Sheets

F I G . 2

| KIND OF LOW-k INTERLAYER FILM | A | B | C | D |
|---|---|---|---|---|
| DIELECTRIC CONSTANT | 3.0 | 2.8 | 2.6 | 2.5 |
| CRACKING | OK | OK | NG | NG |

F I G. 4
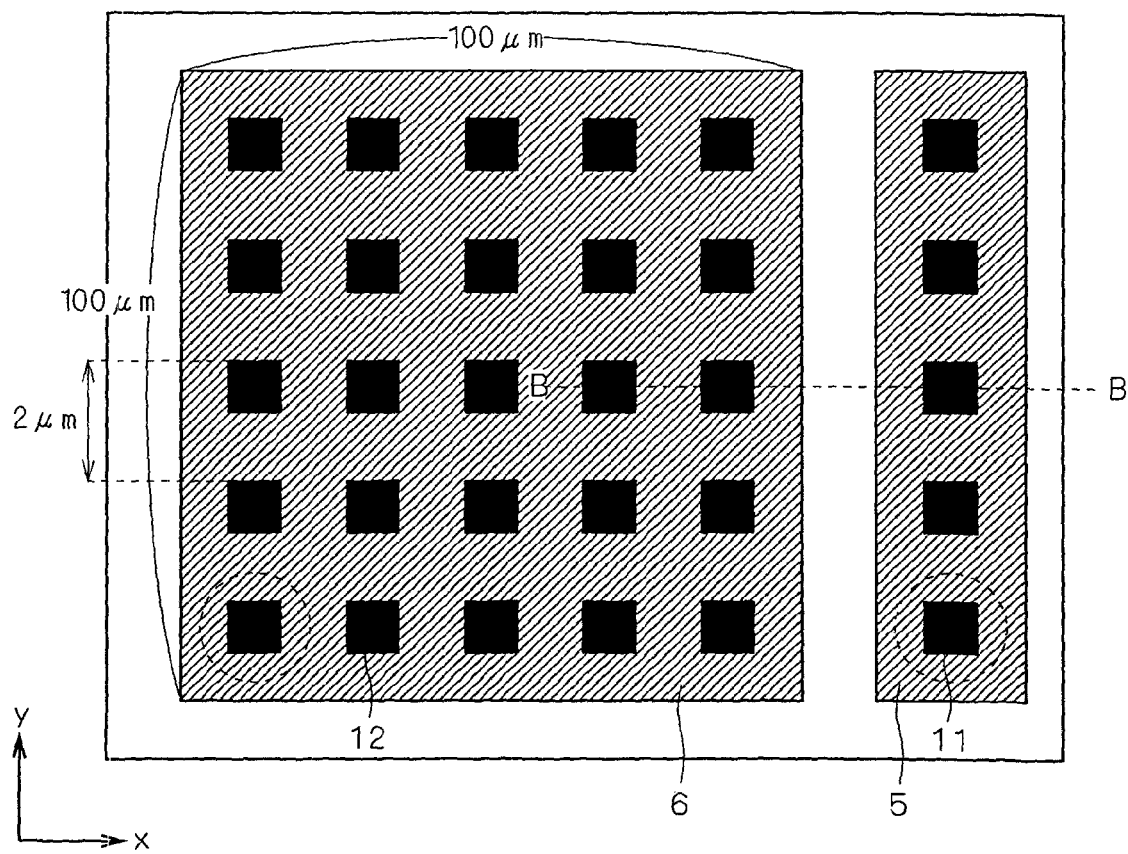
F I G. 5
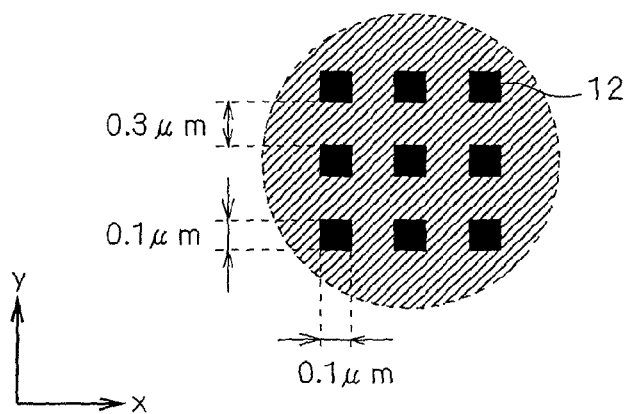

F I G . 6
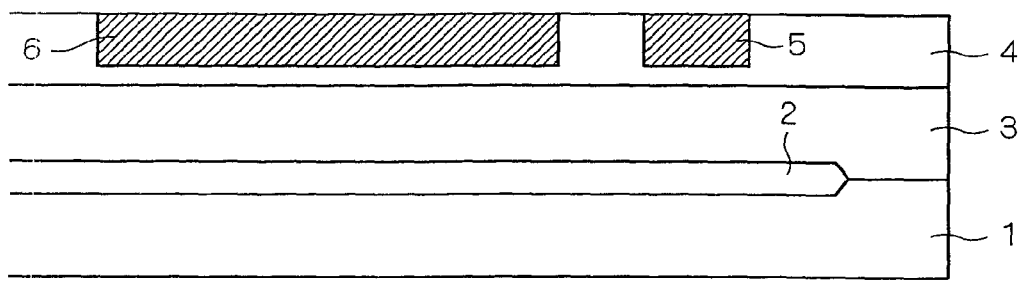
F I G . 7
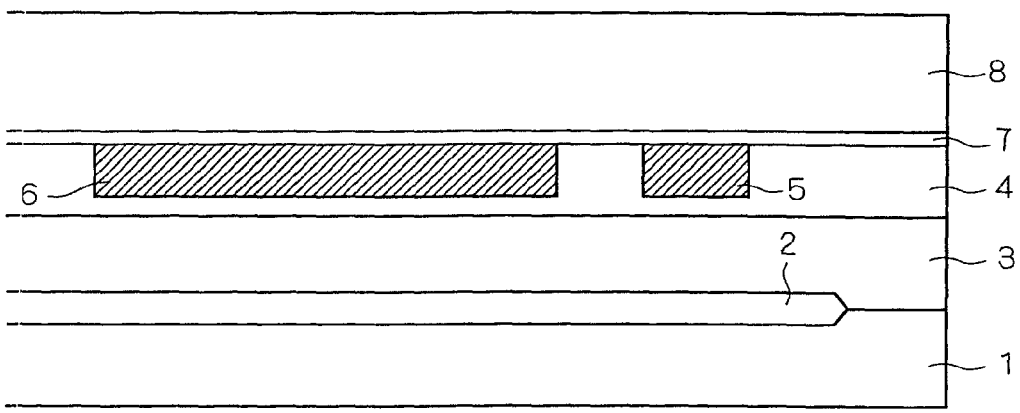

SEMICONDUCTOR DEVICE

This application is a continuation application of prior U.S. application Ser. No. 12/461,134, filed Aug. 3, 2009, the disclosure of which is incorporated herein by reference in its entirety. The parent application is a continuation application of prior U.S. application Ser. No. 12/186,973, filed Aug. 6, 2008, the disclosure of which is incorporated herein by reference in its entirety. The grandparent application is a continuation application of U.S. application Ser. No. 11/455,699, filed Jun. 20, 2006, the disclosure of which is incorporated herein by reference in its entirety. The grandparent application claims priority to Japanese Application No. 2005-183264, filed Jun. 23, 2005, the disclosure of which is incorporated herein by reference in its entirety.

BACKGROUND OF THE INVENTION

1. Field of the Invention

The present invention relates to a semiconductor device, and can, for example, be applied to a semiconductor device with a multi-layer wiring configuration comprising a pad part, a plurality of interlayer insulation films and wiring arranged in the interlayer insulation films.

2. Description of the Background Art

There exists a semiconductor device where a plurality of layers of interlayer insulation films are stacked on a semiconductor substrate and a pad part is placed on the top layer of the interlayer insulation films. Here, multi-layer wiring and vias for connecting each of the wiring are formed in the interlayer insulation films.

Further, with advancement of micro-fabrication of the semiconductor device having the above-mentioned configuration, a bonding pad of the device has been reduced in size. Moreover, there has posed a problem of signal delay due to the micro-fabrication. From the view point of preventing the signal delay and the like, an insulation layer with a lower dielectric constant than that of a silicon oxide has been applied as the interlayer insulation film. Here, generally, a porous insulation film is often applied as the insulation film with a low dielectric constant.

However, the above-mentioned insulation film with a low dielectric constant has relatively small strength. Therefore, when the insulation film with a low dielectric constant is applied, cracking might occur in the insulation film with a low dielectric constant at the time of bonding with respect to the pad part. Further, the insulation film with a low dielectric constant typically has unfavorable adhesiveness to other members. Hence, when the insulation film with a low dielectric constant is applied, film-peeling might occur on the upper face (or lower face) of the insulation film with a low dielectric constant at the time of probing with respect to the pad part.

As a technique for suppressing occurrence of cracking and film-peeling, for example, Japanese Patent Application Laid-Open No. 2001-267323 is cited.

In the technique according to Japanese Patent Application Laid-Open No. 2001-267323, a dummy pattern was formed in every layer of the insulation films with a low dielectric constant under the pad part. Here, in Japanese Patent Application Laid-Open No. 2001-267323, the dummy pattern is formed in each of the insulation films having smaller mechanical strength and lower dielectric constant (e.g., insulation films with a dielectric constant k of less than 4) than those of silicon oxide film. Here, generally, a porous insulation film is often applied as the insulation film with a low dielectric constant.

As thus described, in Japanese Patent Application Laid-Open No. 2001-267323, the dummy pattern is formed in each of the insulation films having smaller mechanical strength and lower dielectric constant (e.g., insulation films with a dielectric constant k of less than 4) than those of silicon oxide film.

Accordingly, regions for forming wiring and the like which function as elemental devices are reduced. Further, there has occurred a problem in that the production process becomes complex to increase production cost.

SUMMARY OF THE INVENTION

An object of the present invention is to provide a semiconductor device capable of effectively using the inside of an interlayer insulation film for arrangement of wiring and the like to function as elemental devices, and reducing production cost.

According to the present invention, a semiconductor device includes a semiconductor substrate, a plurality of layers of interlayer insulation films, and at least one pad part. The plurality of layers of interlayer insulation films are formed on the semiconductor substrate. The pad part is formed on the upper face of the interlayer insulation films. Further, the plurality of interlayer insulation films include a layer of a low dielectric constant film with a dielectric constant of less than 2.7. Moreover, a hard material with a larger hardness than that of the low dielectric constant film is formed at a part under the pad part only in the low dielectric constant film layer among the plurality of layers of interlayer insulation films.

A problem such as occurrence of cracking occurrence or the like in the low dielectric constant film present at a part under the pad part can be solved even when a bonding process or the like is performed on the pad part. Further, from the view point of preventing occurrence of such cracking, only a truly necessary interlayer insulation film (low dielectric constant film) is formed of a different member. It is therefore possible to effectively use the inside of the interlayer insulation film for arrangement of wiring and the like to function as elemental devices. Moreover, since an unnecessary part is not formed of the material with large hardness, it is possible to simplify the manufacture and reduce the production cost.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a view showing measurement results;

FIG. 4 is a perspective plan view showing the configuration of the semiconductor device according to the first embodiment;

FIG. 5 is an expanded plan view showing a configuration of a via pattern and a second dummy pattern;

FIG. 6 is a process sectional view for explaining a method for producing the semiconductor device according to the first embodiment;

FIG. 7 is a process sectional view for explaining a method for producing the semiconductor device according to the first embodiment;

DESCRIPTION OF THE PREFERRED EMBODIMENTS

Figure 1:
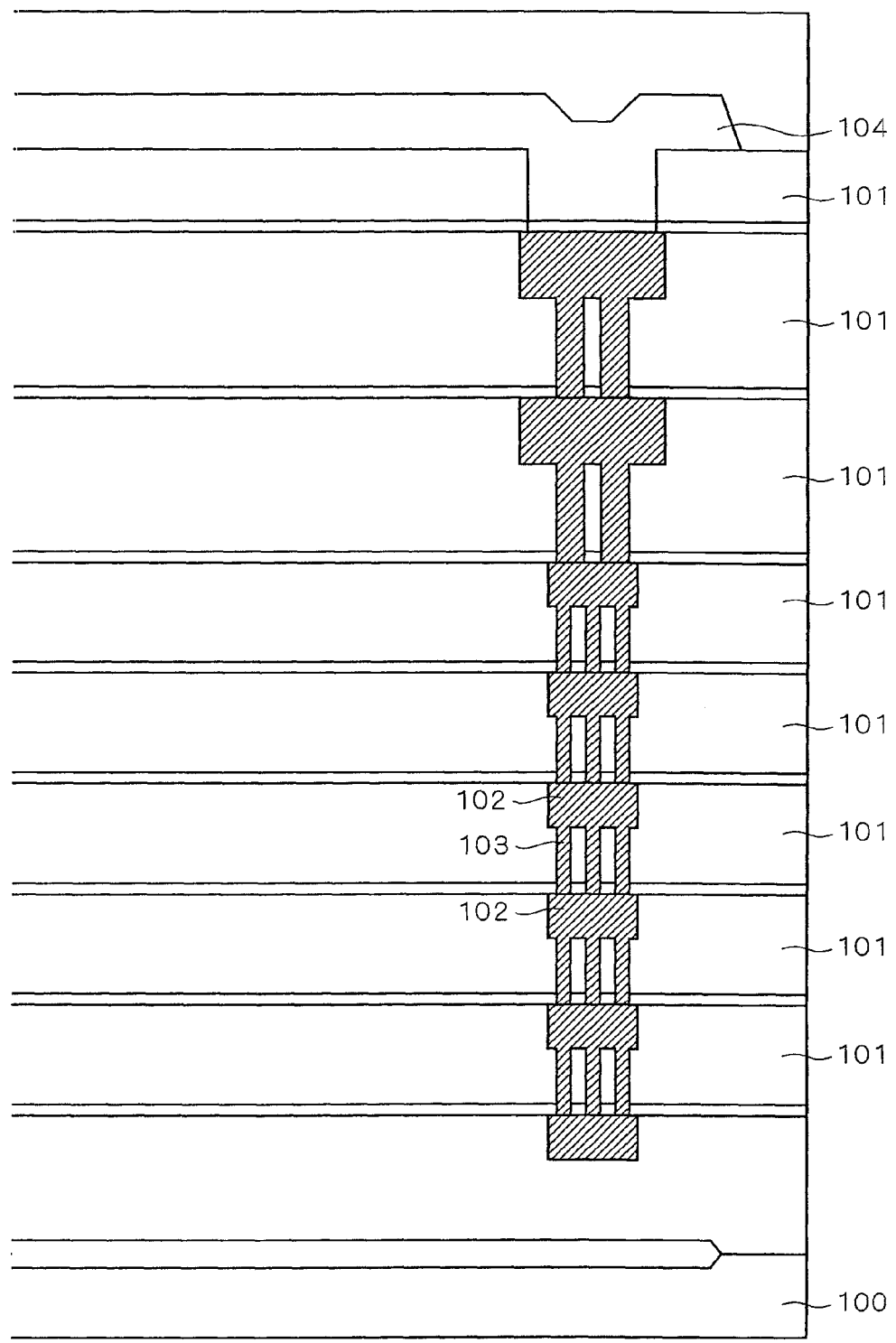
FIG. 1 is a cross sectional view showing part of a semiconductor device as a measured object.

The present inventor made an experiment on a semiconductor device having a cross sectional configuration shown in FIG. 1. In the experiment, a dielectric constant of interlayer insulation films 101 was changed, a bonding process, a probing process and the like were performed on a pad part 104, and values of the dielectric constant of the interlayer insulation films 101 with which cracking or film-peeling would occur in the interlayer insulation films 101 were checked.

In the semiconductor device as an experimented object, as shown in FIG. 1, a plurality of layers of interlayer insulation films 101 are formed on a semiconductor substrate 100. Further, as shown in FIG. 1, wirings 102 and via patterns 103 for connecting the wiring 102 on the upper and lower layers are formed within the interlayer insulation films 101. A pad part 104, connected with the wirings 102, is formed on the top-layer interlayer insulation film 101.

FIG. 2 shows results of the above experiment (especially, experimental results regarding occurrence of cracking). In FIG. 2, "OK" means nonoccurrence of cracking while "NG" means occurrence of cracking.

From results of a variety of experiments including the experimental results of FIG. 2, the inventor found that cracking or film-peeling occurs when the dielectric constant k of the interlayer insulation film 101 is less than 2.7 (hereinafter, the interlayer insulation film 101 with a dielectric constant k of less than 2.7 is referred to as a low dielectric constant film). Namely, when the interlayer insulation film 101 with a dielectric constant k of not less than 2.7 is adopted, cracking or the like does not occur even with the bonding process and the like performed on the pad part 104.

Therefore, the semiconductor device according to the present invention is characterized in that a material with a larger hardness than that of the low dielectric constant film with a dielectric constant of less than 2.7 is formed in every low dielectric constant film at a part under the pad part. Namely, the semiconductor device is characterized in that in a case where a plurality of layers of interlayer insulation films are provided, materials with a larger hardness than that of the low dielectric constant films with a dielectric constant of less than 2.7 are formed only in the layer of the low dielectric constant films among the plurality of layers of interlayer insulation films, at a part under the pad part.

As thus described, replacement of a prescribed part of the low dielectric constant films by materials with a larger hardness can prevent occurrence of cracking in the interlayer insulation films even when the bonding process and the like are performed on the pad part.

In the following, the present invention is specifically described based upon drawings showing embodiments of the present invention. It is to be noted that in the following embodiments, a case is mentioned where an electric conductor (more specifically, a dummy pattern) is applied as the material with the above-mentioned hardness. However, the material is not necessarily limited to this, and an insulation film may also be adopted as a material with a larger hardness than above.

First Embodiment

Figure 3:
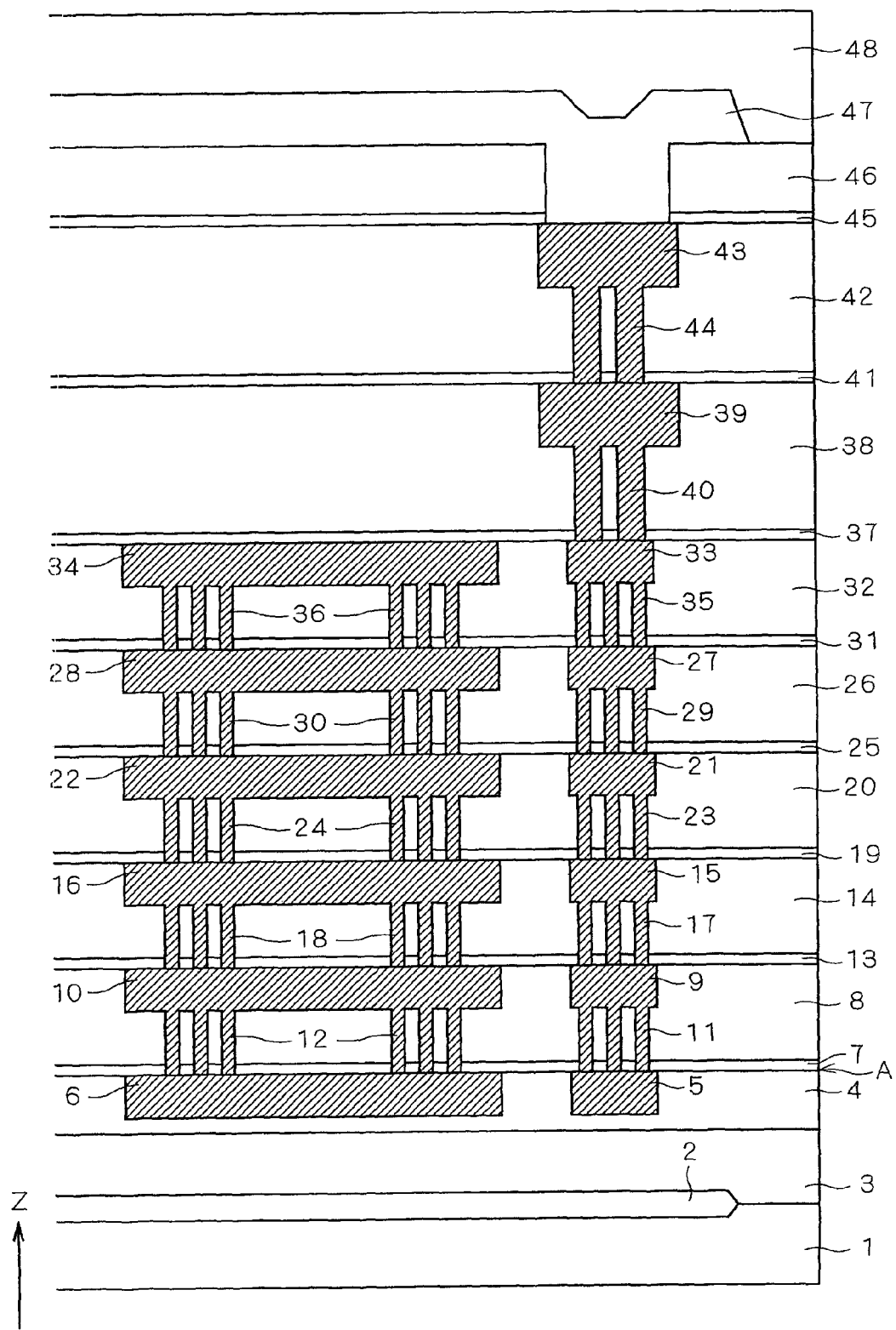
FIG. 3 is a cross sectional view showing a configuration of a semiconductor device according to a first embodiment.

FIG. 3 is a cross sectional view showing a configuration of a semiconductor device according to a first embodiment. Further, FIG. 4 is a plan view showing a plane configuration of a layer "A" in the semiconductor device shown in FIG. 3. Here, it can be grasped that the cross sectional view of FIG. 3 is a view obtained when the semiconductor device is cut off along a cross sectional line of B-B shown in FIG. 4.

It is to be noted that in this description, the dummy pattern formed simultaneously with the wiring pattern is referred to as a dummy pattern of wiring (in the following, the dummy pattern of wiring is referred to as a first dummy pattern). Further, a dummy pattern simultaneously formed with a via pattern is referred to as a dummy pattern of a via (in the following, the dummy pattern of a via is referred to as a second dummy pattern).

Moreover, in FIG. 4, regions where via patterns 11 and second dummy patterns 12 are formed are filled in with black for the convenience of the figure. However, as seen from FIG. 5 being an enlarged view of dotted-line regions of FIG. 4, a plurality of via patterns 11 (or a plurality of second via patterns 12) are practically formed.

Next, the configuration of the semiconductor device according to the present embodiment is described using the drawings shown in FIGS. 3 to 5.

As shown in FIG. 3, an isolation oxide film 2 such as an HDP (high density plasma) oxide film is formed within the surface of a semiconductor substrate 1 such a silicon substrate. Here, the isolation oxide film 2, for example, has a thickness of the order of 300 nm.

Further, a contact interlayer film 3 such as a USG (undoped silicate glass) oxide film is formed on the semiconductor substrate 1 where the isolation oxide film 2 is formed. Here, the contact interlayer film 3, for example, has a thickness of the order of 400 nm. It should be noted that gate electrodes, contacts and the like are also formed on the contact interlayer film 3. However, the gate electrodes, the contacts and the like are omitted in the figure.

Further, an interlayer insulation film 4 with a dielectric constant k of less than 2.7 (hereinafter, the interlayer insulation film with a dielectric constant k of less than 2.7 is referred to as a low dielectric constant film) is formed on the contact interlayer film 3. Here, the low dielectric constant film 4, for example, has a thickness of the order of 150 nm. It is to be noted that a TEOS oxide film may be formed in place of the low dielectric constant film 4.

Further, a wiring pattern 5 that functions as an elemental device (hereinafter, the wiring pattern that functions as an elemental device is simply referred to as a wiring pattern) and a first dummy pattern 6 that does not function as an elemental device (hereinafter, the first dummy pattern that does not function as an elemental device is simply referred to as a first dummy pattern) are formed within the surface of the low dielectric constant film 4.

Here, the first dummy pattern 6 is an electric conductor made of a material of the same sort as that of the wiring pattern 5 (e.g., an electric conductor containing copper). Further, as shown from FIGS. 3 and 4, the first dummy pattern 6 and the wiring pattern 5 are formed in the same layer. Moreover, the first dummy pattern 6 and the wiring pattern 5 have the substantially same thickness.

As shown in FIG. 4, the first dummy pattern 6 has a size of the order of 100 μm each in the x and y directions. Further, the first dummy pattern 6 has a size of the order of 150 nm in the z-direction. Although not shown in the figure, the first dummy patterns 6 are formed in a plurality of numbers in a horizontal direction at a pitch of the order of 120 μm within a region under a pad part 47.

Further, the first dummy pattern 6 is formed within the surface of the first main face of the low dielectric constant film 4. The above-described characteristic of the first dummy pattern 6 is in common with those of below-described first dummy patterns 10, 16 and the like.

It is to be noted that the wiring pattern 5 and the first dummy pattern 6 are respectively composed of a barrier metal film and a Cu film. The barrier metal film is configured by formation of a Ta film having a thickness of the order of 10 nm on TaN having a thickness of the order of 10 nm. Further, the Cu film has a thickness of the order of 150 nm.

A liner film 7 such as an SiC film is formed on the low dielectric constant film 4 where the wiring pattern 5 and the first dummy pattern 6 are formed. Here, the liner film 7, for example, has a thickness of the order of 50 nm. Further, the liner film 7 has large mechanical strength and is not porous. The liner film 7 functions to prevent diffusion of an electric conductor, and functions as an etching stopper and the like.

Further, a low dielectric constant film 8 having a thickness of the order of 350 nm is formed on the liner film 7.

Moreover, a wiring pattern 9 and a first dummy pattern 10 are formed in the low dielectric constant film 8. A via pattern 11 that functions as an elemental device (hereinafter, the via pattern that functions as an elemental device is simply referred to as a via pattern), and a second dummy pattern 12 (hereinafter, the second dummy pattern that does not function as an elemental device is simply referred to as a second dummy pattern) are formed in the low dielectric constant film 8.

Here, the second dummy pattern 12 is an electric conductor made of a material of the same sort as that of the via pattern 11 (e.g., an electric conductor containing copper). Further, as shown from FIGS. 3 and 4, the second dummy pattern 12 and the via pattern 11 are formed in the same layer. Moreover, the second dummy pattern 12 and the via pattern 11 have the substantially same height.

As shown in FIG. 5, the second dummy pattern 12 has a size of the order of 0.1 μm each in the x and y directions. Further, the second dummy pattern 12 has a size of the order of 350 nm in the z-direction. As shown in FIG. 5, the second dummy patterns 12 are formed in a plurality of numbers in a horizontal direction at a pitch of the order of 0.3 μm. Moreover, the second dummy pattern groups, each composed of the second dummy patterns 12 in 3×3 arrangement as shown in FIG. 5, are formed at a pitch of 2 μm as shown in FIG. 4.

The via pattern 11 connects the wiring pattern 5 and the wiring pattern 9. Further, the second dummy pattern 12 connects the first dummy pattern 6 and the first dummy pattern 10.

The above-described characteristic of the second dummy pattern 12 is in common with those of below-described second dummy patterns 18, 24 and the like.

It is to be noted that the via pattern 9 and the second dummy pattern 10 are respectively composed of a barrier metal film and a Cu film. The barrier metal film is configured by formation of a Ta film having a thickness of the order of 10 nm on TaN having a thickness of the order of 10 nm. Further, the Cu film has a thickness of the order of 200 nm.

The layer figuration from the above-mentioned liner film 7 to the low dielectric constant film 8 (including the wiring pattern 9, the first dummy pattern 10 and the like) are repeatedly formed on the low dielectric constant film 8.

Namely, a liner film 13 is formed on the low dielectric constant film 8, and a low dielectric constant film 14 is formed on the linear film 13. Here, a wiring pattern 15, a first dummy pattern 16, a via pattern 17, and a second dummy pattern 18 are formed within the low dielectric constant film 14 in the same configuration as described above.

Further, a liner film 19 is formed on the low dielectric constant film 14, and a low dielectric constant film 20 is formed on the linear film 19. Here, a wiring pattern 21, a first dummy pattern 22, a via pattern 23, and a second dummy pattern 24 are formed within the low dielectric constant film 20 in the same configuration as described above.

Moreover, a liner film 25 is formed on the low dielectric constant film 20, and a low dielectric constant film 26 is formed on the linear film 25. Here, a wiring pattern 27, a first dummy pattern 28, a via pattern 29, and a second dummy pattern 30 are formed within the low dielectric constant film 26 in the same configuration as described above.

Furthermore, a liner film 31 is formed on the low dielectric constant film 26, and a low dielectric constant film 32 is formed on the linear film 31. Here, a wiring pattern 33, a first dummy pattern 34, a via pattern 35, and a second dummy pattern 36 are formed within the low dielectric constant film 32 in the same configuration as described above.

A liner film 37 is formed on the low dielectric constant film 32 and an interlayer insulation film 38 such as a TEOS (tetraethoxysilane) film is formed on the linear film 37. Here, the interlayer insulation film 38, for example, has a thickness of the order of 700 nm. Further, the interlayer insulation film 38 has a dielectric constant k of not less than 2.7.

A wiring pattern 39 and a via pattern 40 are formed within the interlayer insulation film 38. Here, the via pattern 40 connects the wiring pattern 39 and the wiring pattern 33. It is to be noted that the wiring pattern 39 is composed of a barrier metal film and a Cu film. The barrier metal film is configured by formation of a TaN film having a thickness of the order of 10 nm on Ta having a thickness of the order of 10 nm. Further, the Cu film has a thickness of the order of 350 nm.

A liner film 41 is formed on the interlayer insulation film 38, and an interlayer insulation film 42 such as a TEOS (tetraethoxysilane) film is formed on the linear film 41. Here, the interlayer insulation film 42, for example, has a thickness of the order of 700 nm. Further, the interlayer insulation film 42 has a dielectric constant k of not less than 2.7.

A wiring pattern 43 and a via pattern 44 are formed within the interlayer insulation film 42. Here, the via pattern 44 connects the wiring pattern 43 and the wiring pattern 39. It is to be noted that the wiring pattern 43 is composed of a barrier metal film and a Cu film. The barrier metal film is configured by formation of a TaN film having a thickness of the order of 10 nm on Ta having a thickness of the order of 10 nm. Further, the Cu film has a thickness of the order of 350 nm.

A liner film 45 is formed on the interlayer insulation film 42, and an interlayer insulation film 46 such as a TEOS (tetraethoxysilane) film is formed on the linear film 45. Here, the interlayer insulation film 46, for example, has a thickness of the order of 500 nm. Further, the interlayer insulation film 46 has a dielectric constant k of not less than 2.7. Moreover, an opening is formed in the interlayer insulation film 46 such that the wiring pattern 43 is exposed.

The pad part 47 is formed on the interlayer insulation film 46 so as to fill the opening. The pad part 47 is thus connected with the wiring pattern 43. Here, the pad part 47 is for example composed of a barrier metal film and an AlCu film. The barrier metal film is configured by formation of a TiN film having a thickness of the order of 15 nm on Ti having a thickness of the order of 10 nm. Further, the AlCu film has a thickness of the order of 1000 nm.

It is to be noted that, as apparent from the above-described configurations, the pad part 47 is electrically connected with all the wiring patterns including the wiring patterns 5, 9, and 15, and all the via patterns including the via patterns 11, 17 and 23.

Further, as shown in FIG. 3, a passivation film 48 is formed on the interlayer insulation film 46 so as to cover the pad part 47. It is possible to adopt a p-SiN film (plasma nitride film) or the like as the passivation film 48. Further, the passivation film 48, for example, has a thickness of the order of 1000 nm.

In the above-mentioned configuration, the following point is to be noted regarding the interlayer insulation films (including the low dielectric constant film) under the pad part 47.

Namely, each of the first dummy patterns 6, 10, 16, 22, 28, 34 and each of the second dummy patterns 12, 18, 24, 30, 36 are formed within only each of the low dielectric constant films 4, 8, 14, 20, 26, 32, having a dielectric constant k of less than 2.7. As opposed to this, the above-mentioned dummy pattern is not formed either within the interlayer insulation film 38 or 42 having a dielectric constant k of not less than 2.7.

In addition, the case was mentioned where the low dielectric constant films 8, 14, 20, 26, 32 were single layers. However, stacked interlayer insulation films including the low dielectric constant film, in which an SiOC film, a low dielectric constant film, an SiOC film are formed in this order, may be adopted.

Next, a method for producing a semiconductor device according to the present embodiment is specifically described by the use of a process sectional view.

First, the semiconductor substrate 1 such as a silicon substrate is prepared. An STI (shallow trench isolation) method is performed on the surface of the semiconductor substrate 1. As shown in FIG. 6, the isolation oxide film 2 is formed at a predetermined part within the surface of the semiconductor substrate 1. It is to be noted that the isolation oxide film 2, for example, has a thickness of the order of 300 nm.

Next, the contact interlayer film 3 is formed on the semiconductor substrate 1 so as to cover the isolation oxide film 2 (see FIG. 6). Here, the contact interlayer film 3, for example, has a thickness of the order of 600 nm.

Next, a polishing process is performed on the upper face of the contact interlayer film 3. Thereby, the order of 200 nm of the contact interlayer film 3 is removed. Next, as shown in FIG. 6, the low dielectric constant film 4 having a thickness of the order of 150 nm is formed on the contact interlayer film 3. It should be noted that a TEOS oxide film may be formed in place of the low dielectric constant film 4.

Next, a photolithography process is performed on the low dielectric constant film 4. Thereby, concave parts are formed at predetermined parts within the surface of the low dielectric constant film 4.

Next, a sputtering method is performed on the low dielectric constant film 4. Thereby, a barrier metal film (not shown) of Ta (the order of 10 nm) and TaN (the order of 10 nm) is formed on the upper face (including the side faces and the bottom face of the concave part) of the low dielectric constant film 4.

Next, a copper plating process is performed to form plated copper having a thickness of the order of 500 nm on the barrier metal film. Thereafter, for example, CMP (chemical mechanical polishing) is performed on the plated copper and the like. Thereby, as shown in FIG. 6, the wiring pattern 5 and the first dummy pattern 6, each having a thickness of the order of 150 nm, are formed at the concave parts.

Next, as shown in FIG. 7, the liner film 7 having a thickness of the order of 50 nm is formed on the low dielectric constant film 4. Here, as shown in FIG. 7, the liner film 7 is formed so as to cover the wiring pattern 5 and the first dummy pattern 6. Subsequently, as shown in FIG. 7, the low dielectric constant film 8 having a thickness of the order of 350 nm is formed on the liner film 7.

In addition, although the case was mentioned where the low dielectric constant film 8 was a single layer, stacked interlayer insulation films including a low dielectric constant film may be adopted. The same applies to the below-described low dielectric constant films 14, 20, 26, 32.

Next, the photolithography process is performed on the low dielectric constant film 8. Thereby, openings for formation of the via pattern 11 and openings for formation of the second dummy pattern 12 are formed at predetermined parts within the surface of the low dielectric constant film 8. Moreover, another photolithography process is performed on the low dielectric constant film 8. Thereby, an opening for formation of the wiring pattern 9 and an opening for formation of the first dummy pattern 10 are formed at predetermined parts within the surface of the low dielectric constant film 8.

Figure 8:
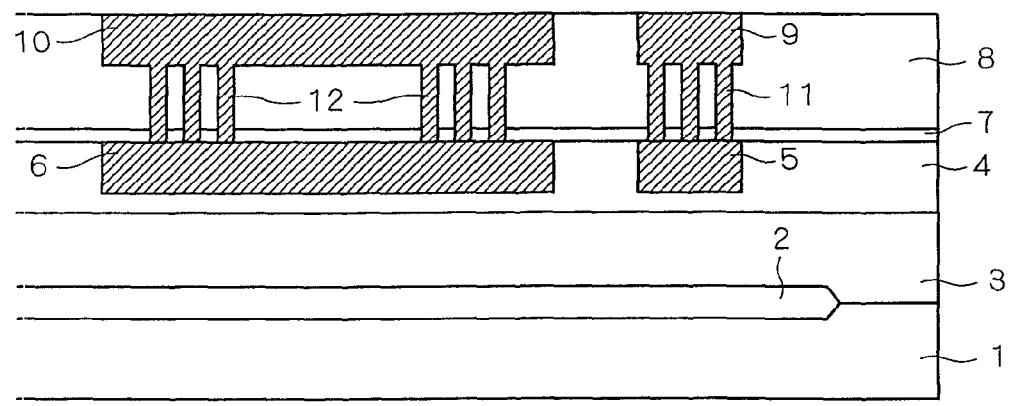
FIG. 8 is a process sectional view for explaining a method for producing the semiconductor device according to the first embodiment.

Next, in the same manner as above, the sputtering method for forming a barrier metal film, the copper plating method, the CMP process for removing extra plated copper, and the like are performed on the low dielectric constant film 8. Accordingly, as shown in FIG. 8, the wiring pattern 9, the first dummy pattern 10, the via pattern 11 and the second dummy pattern 12 are formed within the surface of the low dielectric constant film 8.

In addition, as described above, the via pattern 11 is formed so as to electrically connect the wiring pattern 5 and the wiring pattern 9. Further, the second dummy pattern 12 forms so as to electrically connect the first dummy pattern 6 and the first dummy pattern 10. It is to be noted that the wiring pattern 9 has a thickness of the order of 200 nm.

Next, the above-described formation method of the liner film 7, the low dielectric constant film 8, the wiring pattern 9, the first dummy pattern 10, the via pattern 11 and the second dummy pattern 12 is repeatedly performed. Namely, a fine process is repeatedly performed. Here, the fine process is a process for forming a pattern of 100 nmL/S and 100 nmφ.

Figure 9:
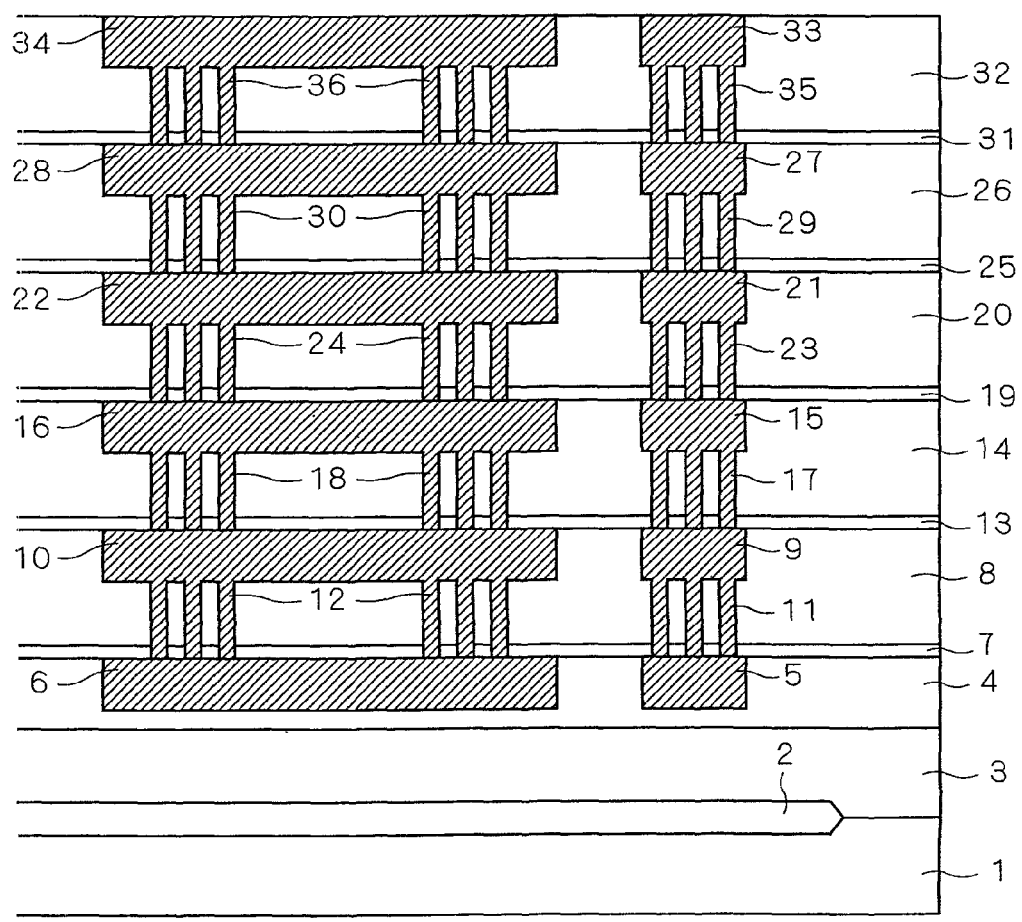
FIG. 9 is a process sectional view for explaining a method for producing the semiconductor device according to the first embodiment.

FIG. 9 shows the condition after the fine process has been repeatedly performed. It is to be noted that the repeated number of the fine process is determined based upon the device design. It is thus unnecessary to limit the number of layers to be formed by the fine process to the case of FIG. 9.

As shown in FIG. 9, the first dummy pattern 10 and the like and the second dummy pattern 12 and the like are formed in the low dielectric constant film 8 and the like having a dielectric constant k of less than 2.7. In particular, the first dummy pattern 10 and the like and the second dummy pattern 12 and the like are formed under the pad part 47 which is later formed.

Figure 10:
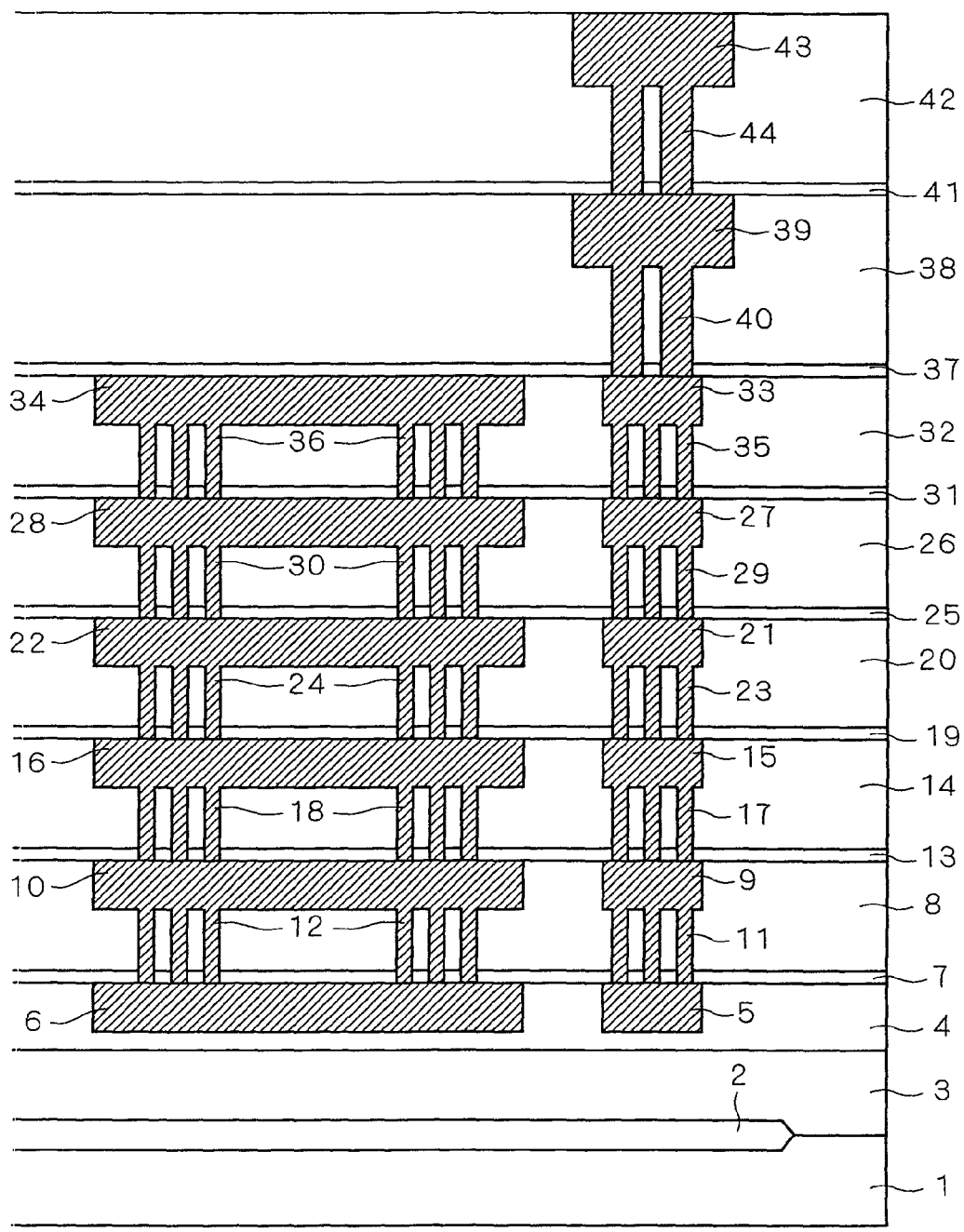
FIG. 10 is a process sectional view for explaining a method for producing the semiconductor device according to the first embodiment.

Next, the liner film 37 having a thickness of the order of 50 nm is formed on the low dielectric constant film 32. Then, a TEOS film having a thickness of the order of 1000 nm is formed on the liner film 37. Thereafter, the order of the 30 nm of the TEOS film is polished to form the interlayer insulation film 38 as shown in FIG. 10. Here, the interlayer insulation film 38 has a dielectric constant k of not less than 2.7.

Next, the photolithography process is performed on the interlayer insulation film 38. Thereby, openings for formation of the via pattern 40 are formed at a predetermined part within the surface of the interlayer insulation film 38. Moreover, another photolithography process is performed on the interlayer insulation film 38. Thereby, an opening for formation of the wiring pattern 39 is formed at a predetermined part within the surface of the interlayer insulation film 38.

Next, in the same manner as above, the sputtering method for forming a barrier metal film, the copper plating method, the CMP process for removing extra plated copper, and the like are performed on the interlayer insulation film 38. Accordingly, as shown in FIG. 10, the wiring pattern 39 and the via pattern 40 are formed within the interlayer insulation film 38.

In addition, as described above, the via pattern 40 is formed so as to electrically connect the wiring pattern 39 and the wiring pattern 33. It is to be noted that the wiring pattern 39 has a thickness of the order of 350 nm.

Next, the above-described formation method of the liner film 37, the interlayer insulation film 38, the wiring pattern 39 and the via pattern 40 is repeatedly performed. Namely, a semi-global process and/or a global process are repeatedly performed. Here, the semi-global process is a process for forming a pattern of 200 nmL/S and 200 nmφ. Further, the global process is a process for forming a pattern of 800 nmL/S and 600 nmφ.

FIG. 10 shows the condition after the semi-global process and/or the global process have been repeatedly performed. It is to be noted that the repeated number of the semi-global process and/or the global process is determined based upon the device design. It is thus unnecessary to limit the number of layers to be formed by the semi-global process and the like to the case of FIG. 10.

As shown in FIG. 10, the first dummy pattern and the second dummy pattern are not formed in the interlayer insulation film 38 and the like having a dielectric constant k of not less than 2.7.

Next, the liner film 45 having a thickness of the order of 50 nm is formed on the interlayer insulation film 42 having a dielectric constant k of not less than 2.7. Thereafter, the interlayer insulation film 46 such as the TEOS film is formed on the liner film 45. Here, the interlayer insulation film 46 has a thickness of the order of 500 nm.

Next, the photolithography process is performed on the interlayer insulation film 46. Thereby, an opening is formed at a predetermined part within the surface of the interlayer insulation film 46. It is to be noted that the wiring pattern 43 is exposed from this opening.

Next, a barrier metal film, which is for example compose of stacked films of TiN (15 nm) and Ti (10 nm), is formed on the interlayer insulation film 46 (including the bottom face part and the side face part of the opening). Then, an AlCu film or the like is formed on the barrier metal film. Thereafter, the formed films are patterned into a predetermined shape to form the pad part 47 as a drawing-out electrode pad which, for example, comprises the barrier metal film and an AlCu film.

Here, as shown in FIG. 3, the pad part 47 fills the opening formed in the interlayer insulation film 46 and is electrically connected with the wiring pattern 43.

Finally, the passivation film 48 is formed on the interlayer insulation film 46 so as to cover the pad part 47. In order to partially expose the pad part 47, an opening (not shown) is formed in part of the passivation film 48.

A semiconductor device shown in FIG. 3 is completed by the processes described above. It should be noted that a p-SiN film (plasma nitride film) may be adopted as the passivation film 48. Further, the passivation film 48 has a thickness of the order of 1000 nm.

As thus described, as for the region under the pad part 47 in the semiconductor device according to the present embodiment, members (the first dummy pattern 10 and the like and the second dummy pattern 12 and the like in the present embodiment) having a larger hardness than that of the low dielectric constant film 8 and the like having a dielectric constant k of less than 2.7 are formed within the low dielectric constant film 8 and the like. Namely, part of the low dielectric constant film 8 is replaced with a harder member.

Therefore, even when the wire bonding process and the like are performed on the pad part 47, it is possible to prevent occurrence of cracking in the low dielectric constant film 8 and the like.

Further, in the semiconductor device according to the present embodiment, members which are harder than the low dielectric constant film 8 and the like having a dielectric constant k of less than 2.7 are formed only within the low dielectric constant film 8 and the like. Namely, the members harder than the above-mentioned low dielectric constant film and the like are not formed within the interlayer insulation film 38 and the like having a dielectric constant k of not less than 2.7.

Therefore, the semiconductor device according to the present embodiment can be more efficiently used for arrangement such as wiring within the interlayer insulation film as compared with the semiconductor device according to Japanese Patent Application Laid-Open No. 2001-267323. Further, since there is no need for forming an extra first dummy pattern or the like, it is possible to simplify manufacture and reduce manufacture cost.

Further, in the semiconductor device according to the present embodiment, the material harder than the above is an electric conductor (e.g., an electric conductor containing copper), and is formed on the first main surface of the low dielectric constant film 4 or the like.

Therefore, even when the probing process is performed on the pad part 47 or the CMP process is performed during production, for example, it is possible to prevent occurrence of film-displacement or film-peeling between the low dielectric constant film 4 and the like and another insulation film in contact with the first main surface side of the low dielectric constant film 4 which are present in the lower layers than the pad part 47.

Moreover, a first dummy pattern 6 and the like having a relatively large area in plan view have been adopted as the above-mentioned electric conductors to be formed within the low dielectric constant film 4 and the like.

It is thus possible to further improve adhesiveness between the low dielectric constant film 4 and another insulation film and the like in contact with the low dielectric constant film 4. It is thereby possible to completely prevent the above-mentioned film displacement and film-peeling, and the like. It is further possible to simultaneously form the first dummy pattern 6 and the like at the time of formation of the wiring pattern 5 and the like.

Moreover, a columnar second dummy pattern 12 and the like have been adopted which are formed by extending in the stacking direction of the interlayer insulation films as the above-mentioned electric conductors to be formed within the low dielectric constant film 4 and the like.

Accordingly, even when the wire bonding process and the like are performed on the pad part 47, it is possible to prevent occurrence of cracking in the low dielectric constant film 4 and the like, as is the above-described case. Further, since being columnar as thus described, the second dummy pattern 12 and the like have the function of being a buffer in the bonding process and the like. Hence it is possible to further alleviate damage to other low dielectric constant films present in the upper and the lower layers and the like which occurs in the wire bonding process and the like. Moreover, it is also possible to form the second dummy pattern 12 and the like simultaneously at the time of formation of the via pattern 11 and the like.

It is to be noted that the first dummy pattern 6 and the like and the second dummy pattern 12 and the like are formed within the low dielectric constant film 4 and the like in the above description. However, a mode may be adopted in which only the first dummy pattern 6 and the like or only the second dummy pattern 12 and the like are formed within the low dielectric constant film 4 and the like.

Further, the case was described in which electric conductors (first dummy pattern 6 and the like) are formed at a part within the low dielectric constant film 4 and the like under the pad part 47. However, it is also possible to replace the whole of the low dielectric constant film 4 under the pad part 47 by the above-mentioned electric conductor and the like.

It is to be noted that as the low dielectric constant film having a dielectric constant k of less than 2.7, for example, a porous SiOC (CVD system, or applied type MSQ (methyl-silses-quioxane) film, a porous organic polymer film or the like, which has a dielectric constant k in the range of 2.0 to 2.5, can be adopted.

Further, other than the SiC film, an SiCN film, an SiCO film, an SiN film or a stacked film of those may be adopted as the liner film. These films are not porous and have relative large hardness.

Second Embodiment

Figure 11:
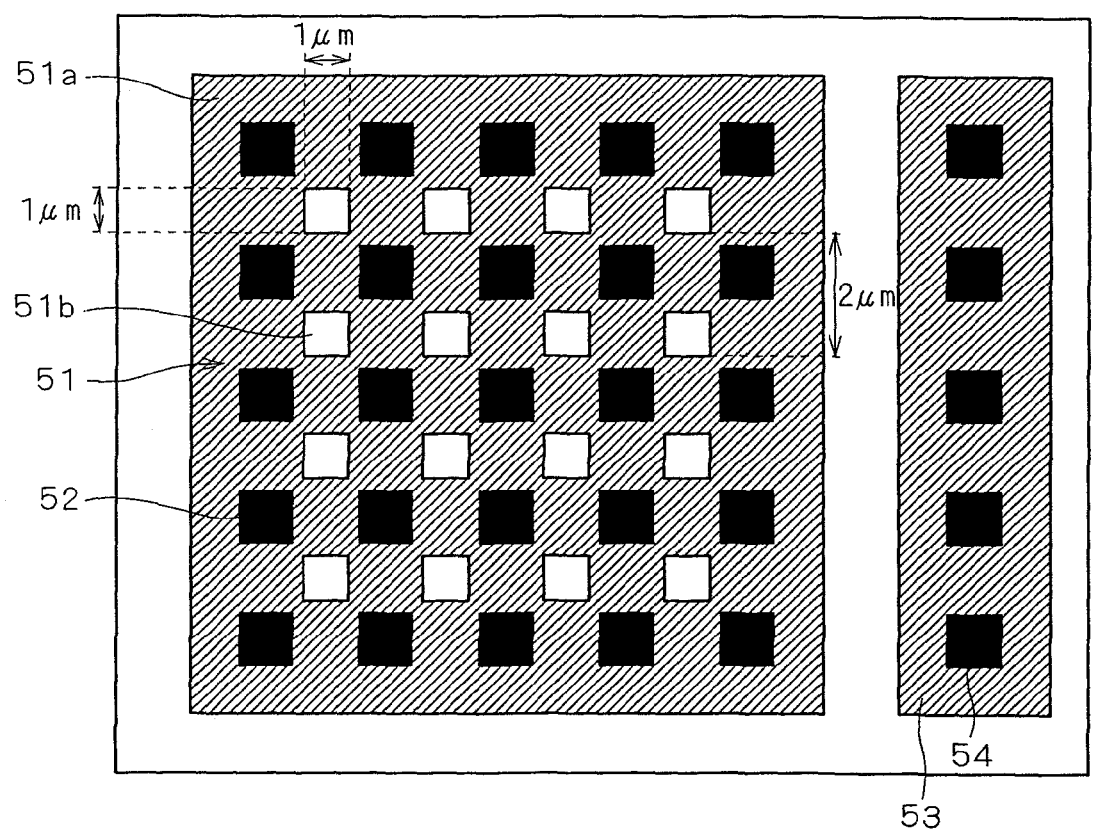
FIG. 11 is a plan view showing a configuration of a first dummy pattern according to a second embodiment.

A semiconductor device according to a second embodiment is characterized in that the first dummy pattern is in mesh shape in plan view. FIG. 11 shows a plan view of a first dummy pattern according to the present embodiment. It should be noted that, since the configuration is the same as that of the first embodiment except for the first dummy patterns, description of the configuration will not be repeated.

As shown in FIG. 11, a wiring pattern 53 which is adjacent to the mesh-shaped first dummy pattern 51 and functions as an elemental device, and a via patterns 54 electrically connected with the wiring 53 are formed.

As for the first dummy pattern 51, a dummy pattern region 51a and meshed regions 51b constitute the first dummy pattern 51. Here, the mesh size of the meshed region 51b is for example the order of 1 square μm, and the mesh formation pitch of the meshed regions 51b is for example the order of 2 μm.

It should be noted that, since the configuration of the second dummy pattern 52 which is connected with the first dummy pattern 51 is the same as in the first embodiment, the description of the configuration will not be repeated here.

As thus described, the first dummy pattern 51 is in mesh shape in the present embodiment. Therefore, even when the area of the first dummy pattern 51 in plan view is designed to be large and the CMP process is performed on the first dummy pattern 51, it is possible to prevent occurrence of dishing of the first dummy pattern 51.

Third Embodiment

Figure 12:
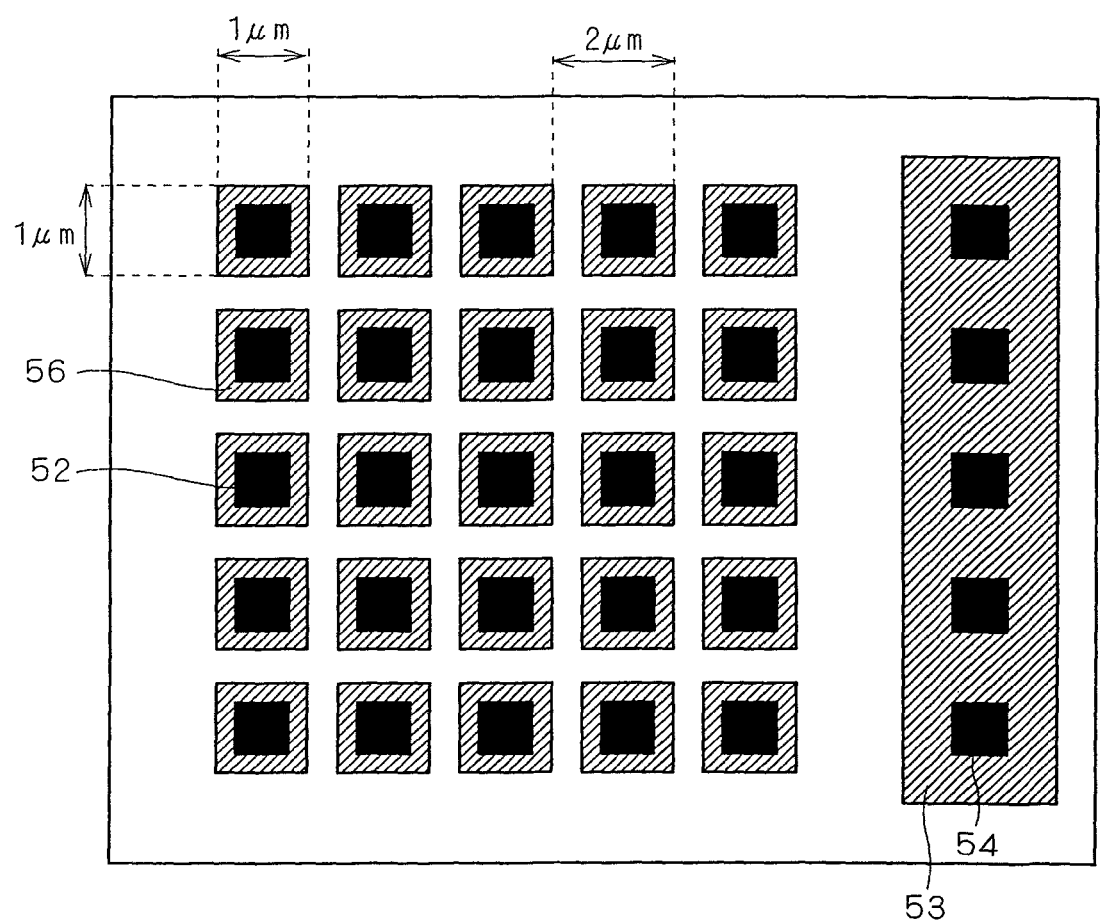
FIG. 12 is a plan view showing a configuration of a first dummy pattern according to a third embodiment.

A semiconductor device according to a third embodiment is characterized in that the first dummy patterns described in the first embodiment are formed by being dotted in island shape in plan view. FIG. 12 shows a plan view of first dummy patterns according to the present embodiment. It should be noted that, since the configuration is the same as that of the first embodiment except for the first dummy patterns, description of the configuration will not be repeated.

As shown in FIG. 12, a wiring pattern 53, which is adjacent to a region where a plurality of first dummy patterns 56 are formed and functions as an elemental device, and a via pattern 54, which is electrically connected with the wiring pattern 53, are formed.

As for the first dummy patterns 56, these patterns are formed in a plurality of numbers by being dotted in island shape. In FIG. 12, the island-shaped first dummy patterns are formed by being dotted in matrix of 5×5. Here, the size of the first dummy pattern 56 is for example the order of 1 square and the formation pitch of the first dummy patterns 56 is for example the order of 2 μm.

In addition, each of the first dummy patterns 56 is connected with the second dummy pattern group described in the second embodiment. Since the configuration of the second dummy pattern 52 is the same as in the first embodiment, the description of the configuration will not be repeated here.

As thus described, the first dummy patterns 56 are formed by being dotted in island shape in the present embodiment. Therefore, even when the area of the plurality of first dummy patterns 56 in plan view are designed to be large and the CMP process is performed on the plurality of first dummy patterns 56 formed within the above range, there is no occurrence of dishing of the first dummy patterns 56.

Namely, in the first dummy pattern 4 and the like described in the first embodiment, dishing might occur when the area of the first dummy pattern 4 and the like are made larger and the CMP process is then performed thereon.

However, the first dummy patterns 56 according to the present embodiment are formed in a plurality of numbers by being dotted in island shape in the range of the area where the first dummy pattern 4 and the like are formed, whereby it is possible to prevent occurrence of the dishing.

Fourth Embodiment

Figure 13:
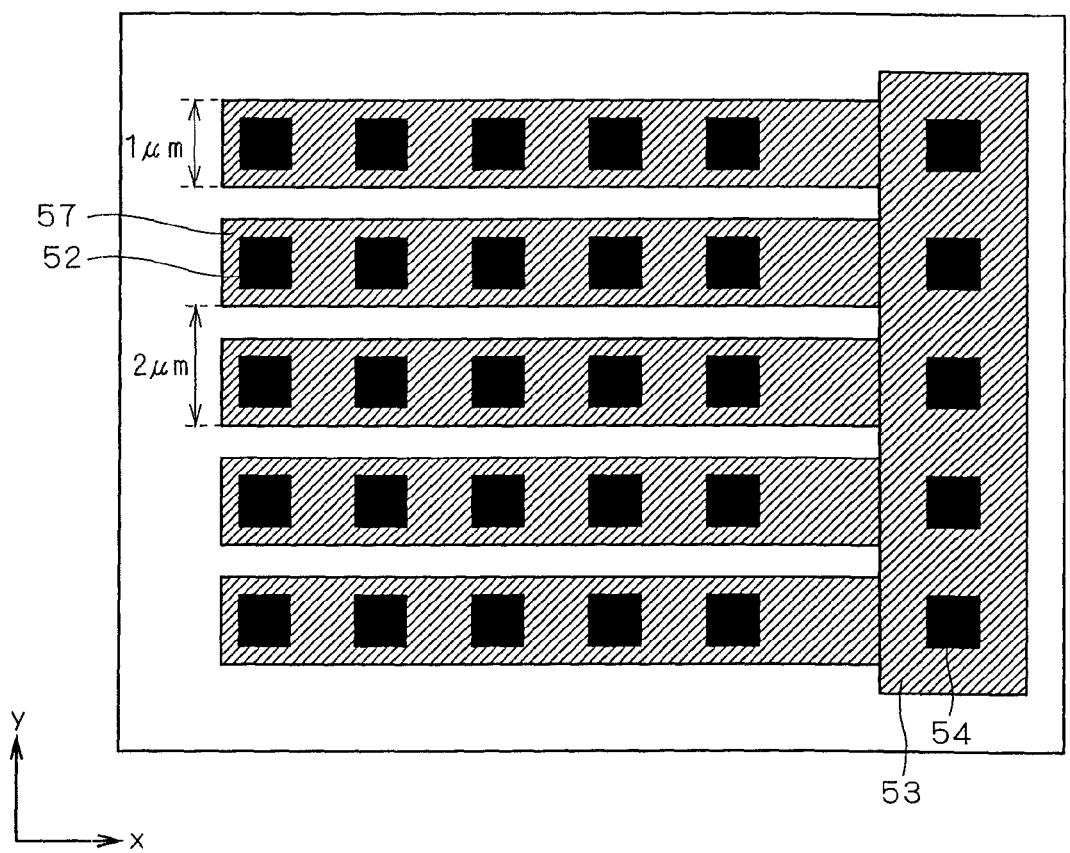
FIG. 13 is a plan view showing a configuration of a first dummy pattern according to a fourth embodiment.

A semiconductor device according to a fourth embodiment is characterized in that the first dummy patterns described in the first embodiment are formed in a plurality of numbers in stripe shape along a predetermined direction in plan view. FIG. 13 shows a plan view of first dummy patterns according to the present embodiment. It should be noted that, since the configuration is the same as that of the first embodiment except for the first dummy pattern, description of the configuration will not be repeated here.

As shown in FIG. 13, a wiring pattern 53, which is adjacent to a region where a strip-shaped plurality of first dummy patterns 57 are formed and functions as an elemental device, and a via pattern 54, which is electrically connected with the wiring pattern 53, are formed.

As for the first dummy pattern 57, these patterns 57 are formed in a plurality of numbers in stripe shape along a predetermined direction (x-direction of FIG. 13 in the present embodiment) in plan view. Here, the width of the first dummy pattern 57 in a direction (y-direction of FIG. 13) perpendicular to the stripe direction is for example the order of 1 μm. Further, the formation pitch of the first dummy patterns 57 is for example the order of 2 μm.

In addition, the respective first dummy patterns 57 are connected with a plurality of second dummy pattern groups described in the second embodiment. Since the configuration of the second dummy patterns 52 is the same as in the first embodiment, the description of the configuration will not be repeated here.

As thus described, the first dummy patterns 57 are formed in stripe shape in the present embodiment. Therefore, as in the second and third embodiments, even when the CMP process is performed on the first dummy patterns 57, it is possible to prevent occurrence of dishing of the first dummy patterns 57.

Fifth Embodiment

Figure 14:
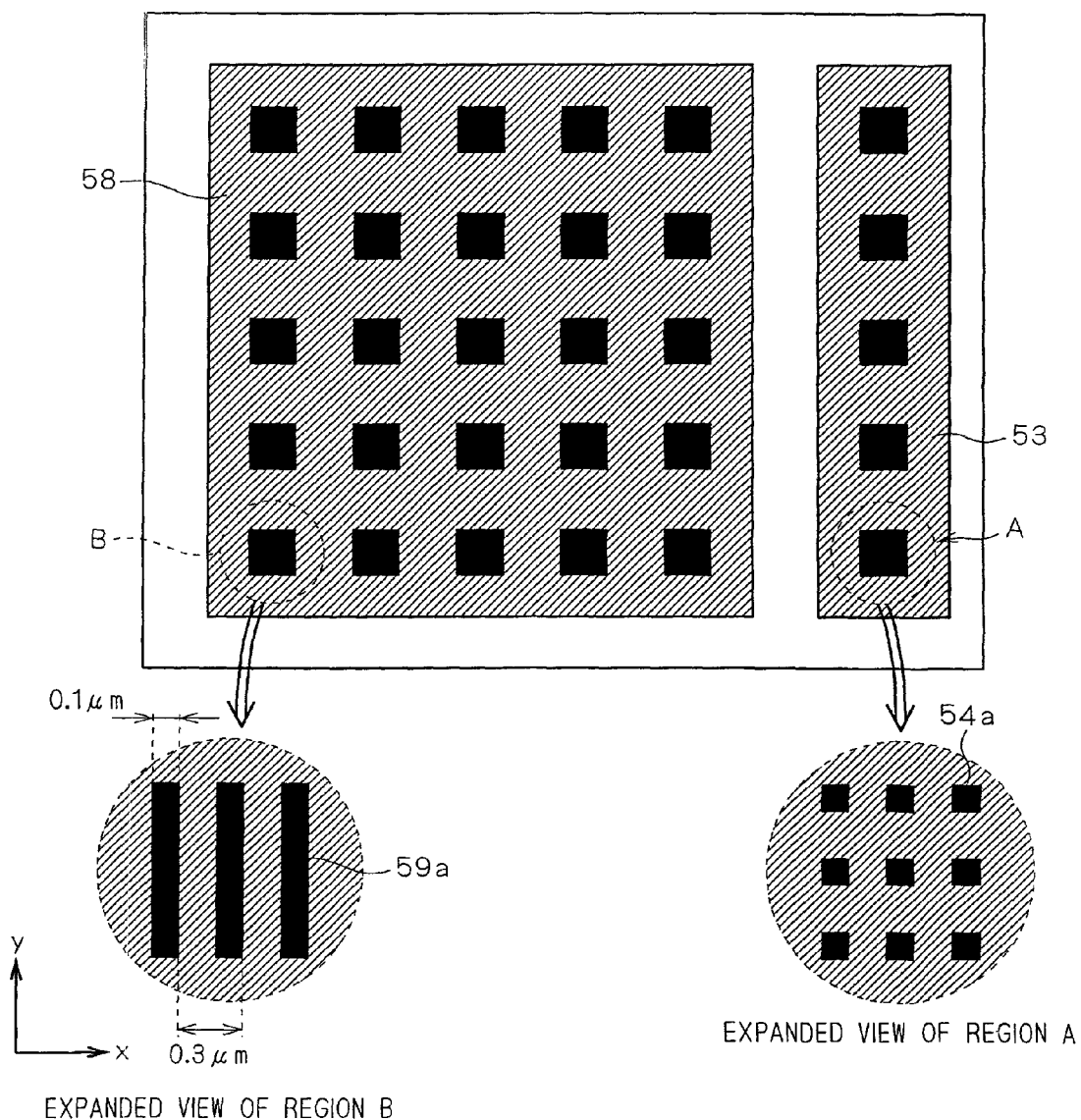
FIG. 14 is a plan view showing a configuration of a second dummy pattern according to a fifth embodiment.

A semiconductor device according to a fifth embodiment is characterized in that the second dummy pattern is formed in stripe shape along a first direction in plan view. FIG. 14 shows a plan view and the like of the second dummy pattern according to the present embodiment.

In FIG. 14, via patterns 54a, electrically connected with the wiring pattern 53 which functions as an elemental device, are formed in a plurality of numbers by being dotted with a predetermined size and a predetermined formation pitch as described in the first embodiment (see an expanded view of a region A of a dotted circle).

However, in FIG. 14, second dummy patterns 59a in contact with the first dummy pattern 58 are formed in stripe shape along the first direction (y-direction of FIG. 14) in plan view as shown in an expanded view of a region B of a dotted circle in FIG. 14.

Here, the strip width of the second pattern 59a (namely, the width of the x-direction of the second dummy pattern) is for example the order of 0.1 μm, and the formation pitch of the second dummy patterns 59a is for example the order of 0.3 μm.

It should be noted that, since the configuration is the same as that of the first embodiment except for what was described above, description of the configuration will not be repeated. Further, there is no need to limit the direction of the stripe of the second dummy patterns 59a to the direction of FIG. 14 (y-direction of the figure). For example, as shown in an expanded view of the region B of a dotted circle in FIG. 15, the direction of the stripe of the second dummy patterns 59a may be in the x-direction of the figure.

Namely, the direction of the stripe of the second dummy patterns 59a can be arbitrarily set.

Since the second dummy patterns 59a are configured as described above, the following effect is exerted in addition to the effect described in the first embodiment.

In the present embodiment, the second dummy patterns 59a are formed in stripe shape. Further, as described in the first embodiment, the second dummy patterns 59a are electric conductors. Moreover, the second dummy patterns 59a are formed within the surface of the first main face of the low dielectric constant film.

Accordingly, as compared with the case of providing no second dummy pattern 59a, the semiconductor device according to the present embodiment can improve adhesiveness between the low dielectric constant film and another insulation film in contact with the low dielectric constant film.

Incidentally, it is assumed that the probing process is performed on the pad part 47 in a direction having a component of a perpendicular direction from the top downward (namely, it can be taken as the stacking direction of the interlayer insulation films and the z-axis direction in FIG. 3) and further, a component of a horizontal direction perpendicular to the above-mentioned perpendicular direction (namely, it can be taken as the x-direction or the y-direction, etc. in FIG. 14 and the like.). Here, it is assumed that the stripe direction of the second dummy patterns 59a is arranged in substantially parallel with the horizontal direction component.

With the strip direction of the second dummy patterns 59a arranged as described above, even when probing is performed in the above-mentioned direction from the contact point (namely, even when the probing operation is performed in the direction including the horizontal direction component), it is possible to prevent film-peeling and the like on the upper and the lower faces of the low dielectric constant film which may occur due to force applied at the time of probing.

It is to be noted that, as described in the first embodiment, a plurality of via patterns which, function as elemental devices (54a in FIG. 14, and the like) are formed along with the second dummy patterns 59a within the interlayer insulation films (including the low dielectric constant film).

In the method for producing the semiconductor device having the above-mentioned configuration, as for a process for simultaneously forming the via patterns and the second dummy patterns 59a, the stripe width of the second dummy pattern 59a (e.g., the width of the second dummy pattern 59a in the x-direction shown in FIG. 14) is set preferably in the following range.

Namely, from the viewpoint of simultaneous production of the via patterns and the second dummy patterns, the desirable stripe width of the second dummy pattern 59a is not smaller than a minimum diameter of the via pattern having the minimum diameter among the plurality of via patterns, and not larger than ten times as large as the minimum diameter.

Figure 15:
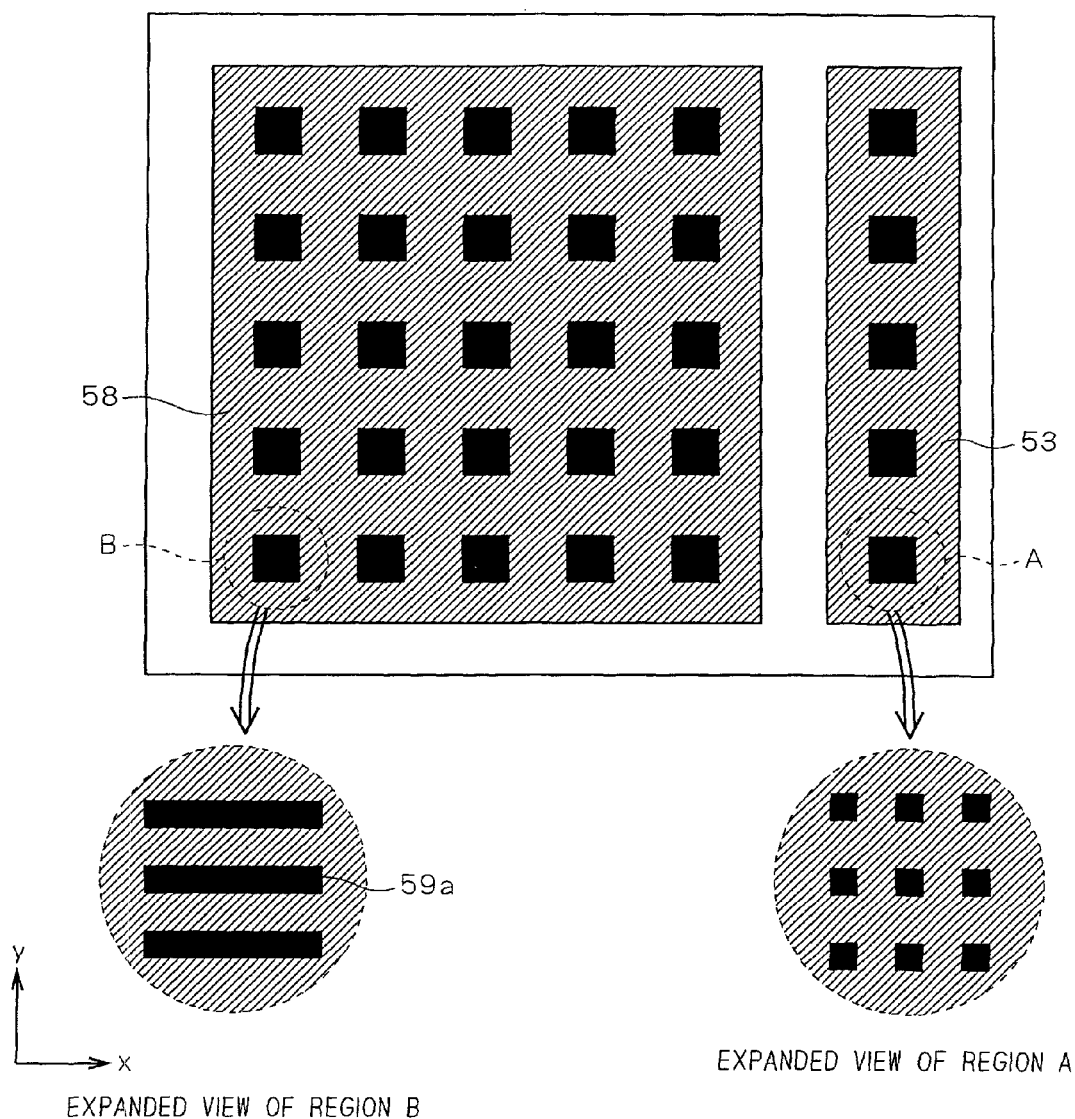
FIG. 15 is a plan view showing another configuration of a second dummy pattern according to the fifth embodiment.

Further, in the expanded views of the region B of the dotted circles in FIGS. 14 and 15, the occupation rate of the second dummy patterns 59a in stripe shape can be arbitrarily set. For example, when the line (stripe) width and the space width are in the same degree, the occupation rate of the region B of the second dummy pattern 59a can be arbitrarily set in the range of 1 to 50%. In addition, it goes without saying that the effect described in the present embodiment can be exerted in selecting any occupation rate.

Sixth Embodiment

In the fifth embodiment, the case was mentioned where the horizontal direction of the probing operation was made substantially parallel with the stripe direction of the second dummy patterns. In the present embodiment, an application of the mentioned case is described.

Figure 16:
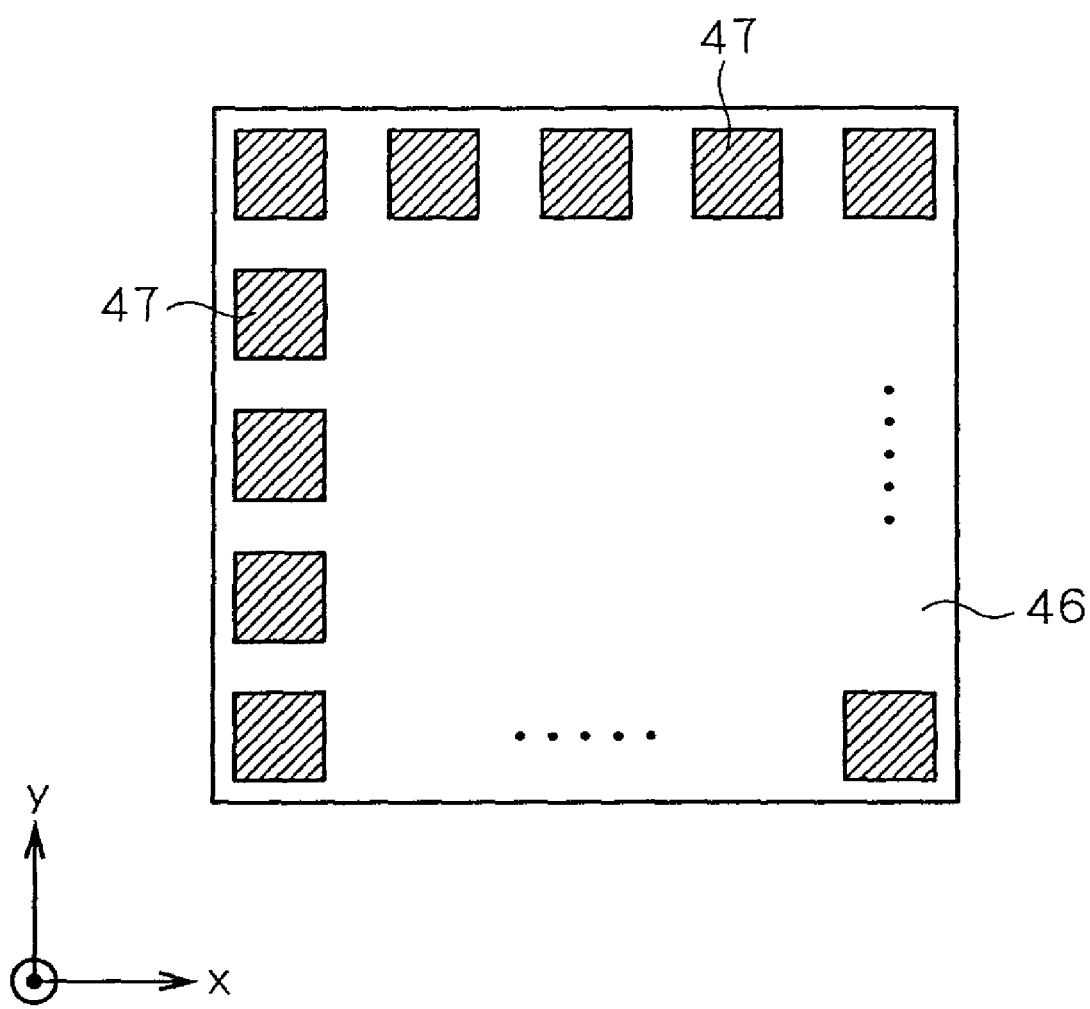
FIG. 16 is a plan view showing appearance of a pad part arranged on the periphery of an interlayer insulation film.

On the periphery of the top-layer interlayer insulation film 46, the pad part 47 may be arranged as follows. Namely, as shown in FIG. 16 which is a plan view, the pad parts 47 may be arranged in a plurality of numbers along a second direction on the interlayer insulation film 46. Here, the second direction can be taken as the x-direction or the y-direction of FIG. 16.

As thus described, when probing is performed on the arranged pad parts 47, the probing direction is typically as follows.

For example, probing is performed on the pad parts 47, having been arranged along the x-direction of the figure, in a direction having a component of the y-direction of the figure in addition to a component of the two-face direction (z-direction) of the figure. As opposed to this, probing is performed on the pad parts 47, having been arranged along the y-direction of the figure, in a direction having a component of the x-direction of the figure in addition to a component of the two-face direction (z-direction) of the figure.

Namely, the arrangement direction (second direction) of the pad parts 47 is typically perpendicular to the horizontal direction component of probing.

Accordingly, the second dummy patterns (numeral 59a in FIGS. 14 and 15) are formed such that the first direction (stripe direction) of the second dummy pattern 59a is substantially perpendicular to the above-mentioned second direction.

As thus described, defining the stripe direction of the second dummy patterns 59a depending upon the arrangement direction of the pad parts 47 can lead to exertion of the effect described in the fifth embodiment. Namely, even when probing is performed in the above-mentioned direction from the contact point (i.e., even when the probing operation is performed in the direction including the horizontal direction component), it is possible to prevent film-peeling and the like on the upper and the lower faces of the low dielectric constant film which may occur due to force applied at the time of probing.

It is to be noted that in the second to fifth embodiments, the specific configurations, of the first dummy pattern and the second dummy pattern were described.

Here, it goes without saying that the configuration of the first dummy pattern described in any of the second to fourth embodiments may be combined with the configuration of the second dummy pattern described in the fifth embodiment.

Figure 17:
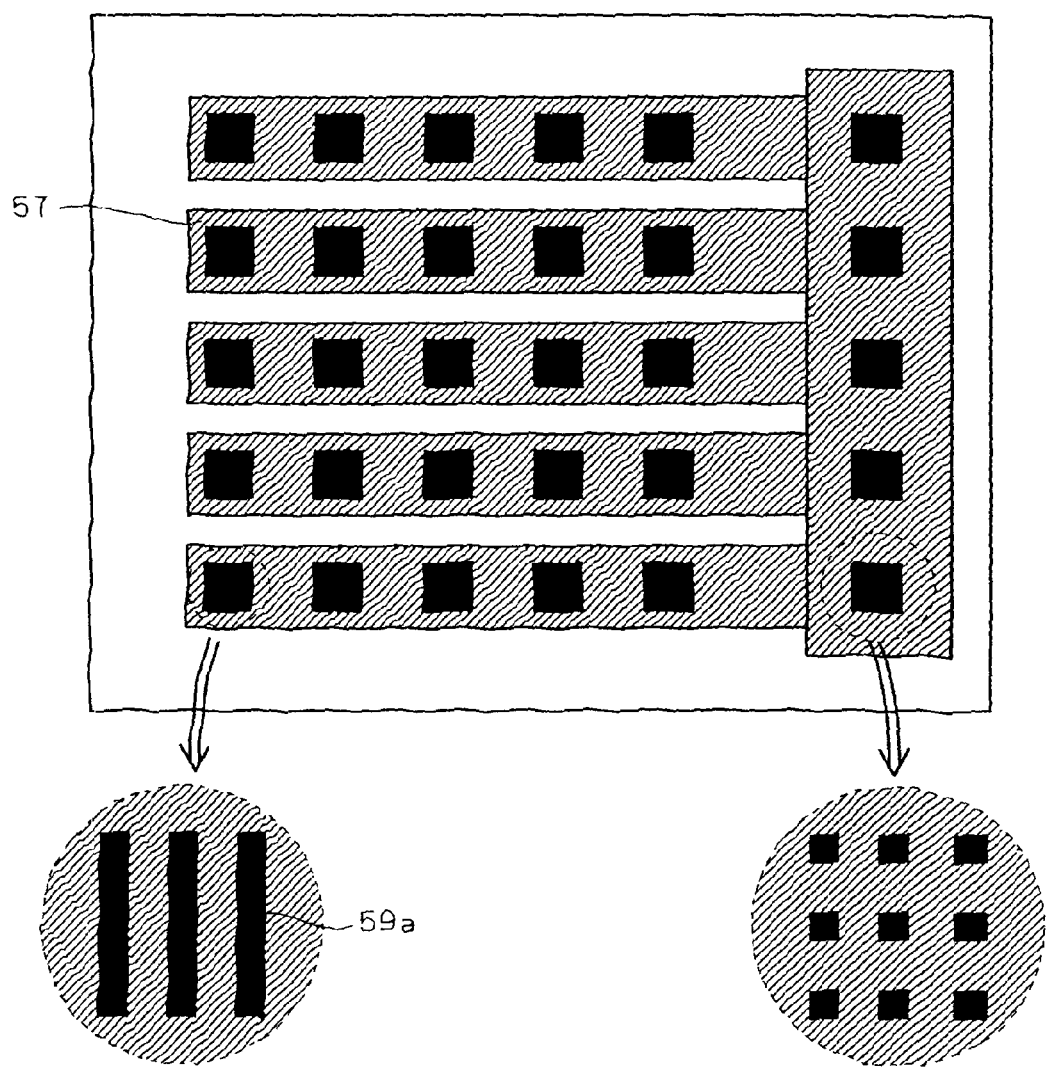
FIG. 17 is a view showing one example of combination of a predetermined first dummy pattern with a predetermined second dummy pattern.

For example, as shown in FIG. 17, a configuration, obtained by combining the first dummy patterns 57 according to the fourth embodiment and the second dummy patterns 59a according to the fifth embodiment, may be adopted.

It should be noted that the semiconductor device with the above-described configuration can be applied, for example, to a CMOS (complementary metal oxide semiconductor), an SOI (silicon on insulation substrate) structure, and an ERAM (embedded random access memory), and the like.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a semiconductor substrate;
a first layer on the semiconductor substrate, wherein the first layer includes a first insulation film and a gate electrode formed on the semiconductor substrate;
a plurality of second layers on the first layer, wherein each of the second layers includes a second insulation film, a plurality of first metal via patterns, and a first metal wiring,
wherein the second insulation film has a dielectric constant of less than 2.7,
wherein the plurality of first metal via patterns are formed in the second insulation film,
wherein a top of each of the first metal via patterns is connected to a bottom of the first metal pattern in the second insulation film, and
wherein the first metal wiring is formed in the second insulation film;
a third layer on the plurality of second layers, wherein the third layer includes a third insulation film, a second metal wiring and a plurality of second metal via patterns,
wherein the third insulation film has a dielectric constant of more than 2.7,
wherein the second metal wiring and the plurality of second metal via patterns are formed in the third insulation film, and
wherein each of the second metal via patterns has a top which contacts with a bottom of the second metal wiring; and
a fourth layer on the third layer, wherein the fourth layer includes a pad electrode, a passivation film and an opening,
wherein the pad electrode includes an aluminum material and electrically connects to the second metal wiring,
wherein the passivation film includes SiN and covers over the pad electrode and the third layer, and
wherein the opening opens the passivation film to expose a part of the pad electrode,
wherein the pad electrode overlays the first metal wiring, the plurality of first metal via patterns, the second metal wiring and the plurality of the second metal via patterns in plan view, and
wherein no dummy metal pattern and no dummy metal via pattern are formed in the third layer directly under the pad electrode.

2. The semiconductor device according to claim 1, wherein the first metal wiring has a larger hardness than the second insulation film.

3. The semiconductor device according to claim 1, wherein the first metal wiring is at least one dummy pattern of wiring.

4. The semiconductor device according to claim 1, wherein the first metal wiring is in mesh shape in plan view.

5. The semiconductor device according to claim 1, wherein the first metal wirings are plural and wherein the first metal wirings are formed by being dotted in island shape in plan view.

6. The semiconductor device according to claim 1, wherein
the first metal wirings are plural, and
the first metal wirings are formed in a plurality of numbers in stripe shape along a predetermined direction in plan view.

7. The semiconductor device according to claim 1,
wherein a bottom of each of the first metal via patterns in the second insulation film is connected to a top of the first metal wiring in the second layer below adjacent to the second layer.

8. The semiconductor device according to claim 1, wherein each of the second layers includes a third metal wiring and a plurality of third metal via patterns,
wherein the third metal wiring and the plurality of third metal via patterns are electrically connected to the second metal wiring,
wherein the third metal wiring and the plurality of third metal via patterns are formed in the second insulation film, and
wherein a top of each of the third metal via patterns contacts with a bottom of the third metal wiring.

9. The semiconductor device according to claim 8,
wherein each of the plurality of the first metal via patterns is formed in a stripe shape along in first direction in plan view, and
wherein a stripe width of the first metal via pattern is not smaller than a minimum diameter of the third metal via pattern having the minimum diameter among the plurality of third metal via patterns, and not larger than ten times as large as the minimum diameter.

10. The semiconductor device according to claim 1,
wherein the second insulation film is a film of one member selected from a group consisting of a SiOC, methyl-silses-quioxane and a porous organic polymer film,
wherein the third insulation film is a TEOS film, and
wherein the first metal wiring, the second metal wiring and the second metal via pattern are made of Cu material.

11. The semiconductor device according to claim 1, wherein the second metal wiring functions as an elemental device.

12. The semiconductor device according to claim 1, further comprising a plurality of first structures,
wherein each of the plurality of the first metal via patterns is formed in a stripe shape along in a first direction in plan view,
wherein the first metal wirings are plural, the second metal wirings are plural, the pad electrodes are plural, and the openings are plural,
wherein each of the first structures is formed on the first layer,
wherein each of the first structures includes the plurality of second layers, the third layer and the fourth layer in a region of the pad electrode in plan view,
wherein each of the first structures includes the plurality of first metal via patterns, the first metal wiring, the second metal wiring, the plurality of second metal via patterns, the pad electrode, and the opening,
wherein each of the first structures is arranged along a second direction in plan view, and
wherein the first direction is substantially perpendicular to the second direction.

13. The semiconductor device according to claim 1, wherein the first metal wiring does not function as an elemental device.

14. The semiconductor device according to claim 1, further including an isolation oxide film in the semiconductor substrate below the pad electrode; and
a plurality of insulation films, each of the plurality of insulation films which includes one film selected from the group consisting of SiC, SiCN, SiCO, and SiN and is formed on each of the second layers,
wherein each of the plurality of second via patterns, the first metal wiring and second metal wiring includes a barrier metal film and a Cu metal film formed on the barrier metal.

15. A semiconductor device comprising:
a semiconductor substrate;
a first layer on the semiconductor substrate, wherein the first layer includes a first insulation film and a gate electrode formed on the semiconductor substrate;
a plurality of second layers on the first layer, wherein each of the second layers includes a second insulation film, a plurality of first metal via patterns, and a first metal wiring,
wherein the second insulation film is a film of one member selected from a group consisting of a SiOC, methyl-silses-quioxane and a porous organic polymer film,
wherein the plurality of first metal via patterns are formed in the second insulation film,
wherein a top of each of the first metal via patterns is connected to a bottom of the first metal pattern in the second insulation film, and
wherein the first metal wiring is formed in the second insulation film;
a third layer on the plurality of second layers, wherein the third layer includes a third insulation film, a second metal wiring and a plurality of second metal via patterns,
wherein the third insulation film has a dielectric constant of more than 2.7,
wherein the second metal wiring and the plurality of second metal via patterns are formed in the third insulation film, and
wherein each of the second metal via patterns has a top which contacts with a bottom of the second metal wiring; and
a fourth layer on the third layer, wherein the fourth layer includes a pad electrode, a passivation film and an opening,
wherein the pad electrode includes an aluminum material and electrically connects to the second metal wiring,
wherein the passivation film includes SiN and covers over the pad electrode and the third layer, and
wherein the opening opens the passivation film to expose a part of the pad electrode,
wherein the pad electrode overlays the first metal wiring, the plurality of first metal via patterns, the second metal wiring and the plurality of the second metal via patterns in plan view, and
wherein no dummy metal pattern and no dummy metal via pattern are formed in the third layer directly under the pad electrode.

16. The semiconductor device according to claim 15, wherein the first metal wiring has a larger hardness than the second insulation film.

17. The semiconductor device according to claim 15, wherein the first metal wiring is at least one dummy pattern of wiring.

18. The semiconductor device according to claim 15, wherein the first metal wiring is in mesh shape in plan view.

19. The semiconductor device according to claim 15, wherein the first metal wirings are plural and wherein the first metal wirings are formed by being dotted in island shape in plan view.

20. The semiconductor device according to claim 15, wherein
the first metal wirings are plural, and
the first metal wirings are formed in a plurality of numbers in stripe shape along a predetermined direction in plan view.

21. The semiconductor device according to claim 15,
wherein a bottom of each of the first metal via patterns in the second insulation film is connected to a top of the first metal wiring in the second layer below adjacent to the second layer.

22. The semiconductor device according to claim 15, wherein
each of the second layer which includes a third metal wiring and a plurality of third metal via patterns,
wherein the third metal wiring and the plurality of third metal via patterns electrically connected to the second metal wiring,
wherein the third metal wiring and the plurality of third metal via patterns are formed in the second insulation film, and wherein a top of each of the third metal via patterns contacts with a bottom of the third metal wiring.

23. The semiconductor device according to claim 22,
wherein each of the plurality of the first metal via patterns is formed in a stripe shape along in first direction in plan view, and
wherein a stripe width of the first metal via pattern is not smaller than a minimum diameter of the third metal via pattern having the minimum diameter among the plurality of third metal via patterns, and not larger than ten times as large as the minimum diameter.

24. The semiconductor device according to claim 15,
wherein the third insulation film is a TEOS film, and
wherein the first metal wiring, the second metal wiring and the second metal via pattern are made of Cu material.

25. The semiconductor device according to claim 15, wherein the second metal wiring is function as elemental device.

26. The semiconductor device according to claim 15, further comprising a plurality of first structures,
wherein each of the plurality of the first metal via patterns is formed in a stripe shape along in first direction in plan view,
wherein the first metal wirings are plural, the second metal wirings are plural, the pad electrodes are plural, and the openings are plural,
wherein each of the first structures is formed on the first layer,
wherein each of the first structures includes the plurality of second layers, the third layer and the fourth layer in a region of the pad electrode in plan view,
wherein each of the first structures includes the plurality of first metal via patterns, the first metal wiring, the second metal wiring, the plurality of second metal via patterns, the pad electrode, and the opening,
wherein each of the first structures is arranged along a second direction in plan view, and
wherein the first direction substantially perpendicular to the second direction.

27. The semiconductor device according to claim 15, wherein the first metal wiring does not function as an elemental device.

28. The semiconductor device according to claim 15, further including an isolation oxide film in the semiconductor substrate below the pad electrode; and
a plurality of insulation film, each of the plurality of insulation film which includes one film selected from SiC, SiCN, SiCO, and SiN and is formed on each of the second layers,
wherein each of the plurality of second via patterns, the first metal wiring and second metal wiring includes a barrier metal film and a Cu metal film formed on the barrier metal.

29. The semiconductor device according to claim 15, wherein the second insulation film has a dielectric constant of less than 2.7.

* * * * *